United States Patent
Noijen et al.

(10) Patent No.: US 9,812,612 B2
(45) Date of Patent: Nov. 7, 2017

(54) SOLID STATE LIGHT EMITTING DEVICE AND METHOD OF MANUFACTURING A SOLID STATE LIGHT EMITTING DEVICE

(71) Applicant: KONINKLIJKE PHILIPS N.V., Eindhoven (NL)

(72) Inventors: Sander Petrus Martinus Noijen, Geldrop (NL); Roy Antoin Bastiaan Engelen, Geleen (NL); Norbertus Antonius Maria Sweegers, Lierop (NL); Marc Andre de Samber, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/036,879

(22) PCT Filed: Nov. 6, 2014

(86) PCT No.: PCT/EP2014/073852
§ 371 (c)(1),
(2) Date: May 16, 2016

(87) PCT Pub. No.: WO2015/074880
PCT Pub. Date: May 28, 2015

(65) Prior Publication Data
US 2016/0329467 A1    Nov. 10, 2016

(30) Foreign Application Priority Data

Nov. 19, 2013    (EP) ..................................... 13193482

(51) Int. Cl.
*H01L 33/38*    (2010.01)
*H01L 33/60*    (2010.01)
(Continued)

(52) U.S. Cl.
CPC .......... *H01L 33/38* (2013.01); *H01L 33/0095* (2013.01); *H01L 33/382* (2013.01); *H01L 33/387* (2013.01); *H01L 2933/0016* (2013.01)

(58) Field of Classification Search
CPC ... H01L 33/38; H01L 33/0095; H01L 33/382; H01L 33/387
(Continued)

(56) References Cited

U.S. PATENT DOCUMENTS 9,246,061 B2 *   1/2016   Lei ........................ H01L 25/167
2004/0026702 A1   2/2004   Yamada et al.
(Continued)

FOREIGN PATENT DOCUMENTS

EP    2555259 A1    2/2013
JP    2004274042 A1    9/2004
WO    2013154818 A1    10/2013

OTHER PUBLICATIONS

EPO as ISA, International Search Report and Written Opinion dated Feb. 11, 2015 from International Application No. PCT/EP2014/073852, filed Nov. 6, 2014, 12 pages.

*Primary Examiner* — Dao H Nguyen

(57) ABSTRACT

A solid state light emitting device includes a light emitting stack (20), a metallization (30), comprising a guard layer (36) of metal, and a dielectric layer (50) over the guard layer (36) of the metallization. During subsequent processing delamination and/or cracking may occur at the edges of the devices, sometimes referred to as die edge defects. To address these defects a plurality of stress-relief elements (62, 64) and/or anchor elements may be provided in an edge region of the metallization and/or dielectric layer for reducing delamination. The stress-relief elements (62, 64) are formed by regions of reduced thickness or increased thickness in the guard layer (36).

12 Claims, 6 Drawing Sheets

(51) Int. Cl.
*H01L 33/62* (2010.01)
*H01L 33/00* (2010.01)

(58) Field of Classification Search
USPC .... 257/13, 88, 96, 98, 99, E33.049, E33.05, 257/E33.055, E33.057, E33.062, E33.066, 257/E21.158, E21.506, E21.599; 438/22, 438/26, 27, 29
See application file for complete search history.

(56) References Cited

U.S. PATENT DOCUMENTS

| | | |
|---|---|---|
| 2010/0227421 A1 | 9/2010 | Neff et al. |
| 2010/0237371 A1 | 9/2010 | Kang et al. |
| 2012/0049219 A1* | 3/2012 | Kamiya ................ H01L 33/382 257/98 |
| 2012/0199861 A1 | 8/2012 | Tsuji |
| 2012/0225505 A1* | 9/2012 | Neff ....................... H01L 33/38 438/26 |
| 2013/0069095 A1* | 3/2013 | Hodota .................. H01L 33/42 257/98 |

\* cited by examiner

SOLID STATE LIGHT EMITTING DEVICE AND METHOD OF MANUFACTURING A SOLID STATE LIGHT EMITTING DEVICE

CROSS-REFERENCE TO RELATED APPLICATIONS

The present application is a §371 application of International Application No. PCT/EP2014/073852 filed on Nov. 6, 2014 and entitled "A Solid State Light Emitting Device and Method of Manufacturing a Solid State Light Emitting Device," which claims priority to European Patent Application No. 13193482.0, filed Nov. 19, 2013. Both PCT/EP2014/073852 and 13193482.0 are incorporated herein.

FIELD OF THE INVENTION

The invention relates to a solid state light emitting device and method of fabrication a solid state light emitting device.

BACKGROUND OF THE INVENTION

Solid state light emitting devices, such as light emitting diodes (LEDs) and laser diodes, are widely used for the generation of light in a wide variety of applications including, for example, displays and lighting, as they represent an efficient light emitting structure.

One example of an approach to manufacturing light emitting diodes is taught by US2010/0283080. A light emitting diode die is formed by depositing a stack of p-, i- and n-type semiconductor layers on a substrate. The active, light emitting layer is the i-type layer. Electrons and holes introduced from the p-type and n-type layers produce light in the active i-type layer sandwiched between the n-type and p-type layers.

Those skilled in the art will realize that a wide variety of semiconductor structures may be used as an alternative to the p-i-n semiconductor stack of layers.

A number of metallic layers may be formed over the stack with a variety of purposes. One layer may be an ohmic contact, providing a good contact to the upper semiconductor layer. For example, US2010/0283080 suggests an ohmic contact layer of Ni, Ag or Pd as an ohmic contact to the upper p-type semiconductor layer. This ohmic contact layer may be thin.

It is also useful to provide a reflective layer to reflect light back and this may be formed as a separate layer of Ag, for example, deposited over the ohmic contact layer.

Other metallization layers may also be provided such as a guard layer. In US2010/0283080 the guard layer is a multilayer of TiW, TiW:N and TiW.

In order to more efficiently manufacture a plurality of diodes, multiple devices are formed on a single substrate and these are then separated. To prepare for such separation, US2010/0283080 teaches forming trenches through the metallization layer and into the semiconductor layers along streets along which the separation will take place at a later stage.

An insulator of dielectric may then be formed in the trenches.

Further metal layers, for example connections to the n-type semiconductor layer, and/or further layers of dielectric may then be formed.

After forming these layers on the substrate, the substrate may be divided into a plurality of dies along the trenches. Thus, the trenches formed earlier in the process function as streets to divide the substrate into individual light emitting diodes each as a separate die. There are a number of different approaches to the separation step, for example scribing, sawing or laser cutting.

The individual dies can then be mounted in a package.

The step of dividing the substrate into individual dies and the packaging process can cause a considerable amount of stress.

The various different metals used for different purposes in the layers of the metallization frequently have a relatively low adhesion with each other and with the semiconductor layers and dielectric. Accordingly, during the step of separation of the dies the resulting stress can cause the layers to separate from one another in an effect known as die edge delamination.

Another effect of the stress may be cracking of one or more of the layers. This can be a particular problem in the dielectric, though other layers may also be affected.

There is thus a need for a manufacturing process and a light emitting diode that takes account of the effects of stress.

WO2013/033685A1 discloses LED dies on an LED substrate wherein singulation is performed to provide multiple LED dies that are joined to a single carrier die. The multiple LED dies on the single carrier die are connected in series and/or in parallel by interconnection in the LED dies and/or in the single carrier die. A crack reducing interlayer is provided on an insulation layer capable of reducing the propagation of cracks through the insulation layer.

EP255259A1 discloses semiconductor light emitting device in which adhesion between an insulating layer and a semiconductor layer is improved while maintaining the ability of the insulating layer to limit the direction of current flow. A metal layer is provided on the semiconductor layer having a higher adhesion with the semiconductor layer than the insulating layer. The metal layer is provided in a shape of islands and the insulating layer fills gaps between these islands.

US2012/199861A1 discloses a semiconductor light emitting element including a light emitting layer and a p-type semiconductor layer laminated on an n-type semiconductor layer, a transparent conductive layer laminated on the p-type semiconductor layer, a transparent insulating layer laminated on the transparent conductive layer and the exposed n-type semiconductor layer, the transparent insulating layer having plural tapered through-holes formed therein, a p-electrode formed on the transparent conductive layer with the transparent insulating layer interposed therebetween, the p-electrode being connected to the transparent conductive layer via the through-holes provided for the transparent insulating layer; and an n-electrode formed on the n-type semiconductor layer with the transparent insulating layer interposed therebetween, the n-electrode being connected to the n-type semiconductor layer via the through-holes provided for the transparent insulating layer.

SUMMARY OF THE INVENTION

The invention is defined by the claims.

According to a first aspect of the invention, there is provided a method of manufacturing solid state light emitting devices, comprising defining a light emitting stack of a plurality of semiconductor layers on a substrate; forming a metallization on the light emitting stack including at least one metallization layer and comprising a guard layer of metal; forming die edge trenches extending into the light emitting stack defining the edge of a plurality of diode devices and edge regions adjacent to the die edge trenches;

forming a dielectric layer on the guard layer of the metallization and in the trenches; wherein the method comprises forming a plurality of stress-relief elements in the edge regions and/or anchor elements in the metallization and/or dielectric layer by forming by regions of increased thickness or reduced thickness in the guard layer and/or in the dielectric layer.

In another aspect, the invention relates to a solid state light emitting device, comprising: a light emitting stack of a plurality of semiconductor layers; a metallization on the light emitting stack including at least one metallization layer and comprising a guard layer; a dielectric layer on the guard layer of the metallization; a plurality of stress-relief elements and/or anchor elements in an edge region of the metallization and/or dielectric layer, the edge region being the region of the solid state light emitting device adjacent to the edge of the solid state light emitting device, wherein the stress-relief elements are formed by regions of increased thickness or reduced thickness in the guard layer.

The stress relief elements and anchor elements may reduce die edge defects which may be caused, for example, by stresses during mounting of the solid state light emitting device in a package or during the division of the solid state light emitting device into plural small dies. In particular, delamination and/or fracture of the multilayer structure may be reduced.

The edge region may extend up to 200•m, in embodiments up to 150•m, or 100•m from the diode device edges.

At least some of the stress relief elements and/or anchor elements formed in the edge regions may have a maximum dimension at least 5•m and be formed within 50•m of the die edge trenches. The stress relief elements and/or anchor elements are formed only in the edge region, because in this edge region the stress relief elements will optimally achieve a reduction of the risk of delamination as a result of the separation of individual solid state light emitting devices or dies.

Forming the metallization may include forming at least some of the stress relief elements by depositing the guard layer of metal with regions of reduced thickness in the guard layer, by depositing the guard layer of metal with holes in the guard layer and/or by forming regions of increased thickness of the guard layer.

At least some of the stress relief elements can also be formed in the dielectric layer, for example by forming regions of increased thickness or reduced thickness of the dielectric layer.

Anchor elements in the metallization may also be provided. These may fix one or more of the layers in the metallization.

In one approach to the provision of anchor elements, the metallization may be formed by depositing an ohmic contact layer; etching through the ohmic contact layer to form holes to expose the light emitting stack; depositing the guard layer over the ohmic contact layer and in the holes to form the anchor elements to anchor the guard layer.

Another approach includes etching into the light emitting stack to form anchor trenches and depositing an ohmic contact layer on the light emitting stack and in the anchor trenches to define the anchor elements.

The use of such anchor elements can increase adhesion of one or more layers of the metallization and hence reduce the risk of delamination.

The method may further include forming a plurality of individual light emitting dies by cleavage along the die edge trenches.

BRIEF DESCRIPTION OF THE DRAWINGS

Examples of the invention will now be described in detail with reference to the accompanying drawings, in which.

The drawings are schematic and not to scale. In particular, the vertical scale may be exaggerated to show multiple layers.

DETAILED DESCRIPTION OF THE EMBODIMENTS

The invention provides a method of fabricating solid state light emitting devices such as light emitting diodes (LEDs) and laser diodes, and the device manufactured by the method. The solid state light emitting device includes a light emitting stack, a metallization and a dielectric over the metallization. During subsequent processing delamination and/or cracking may occur at the edges of the devices, sometimes referred to as die edge defects. To address these defects a plurality of stress-relief elements and/or anchor elements are provided in an edge region of the metallization and/or dielectric layer for reducing delamination.

Figure 1:
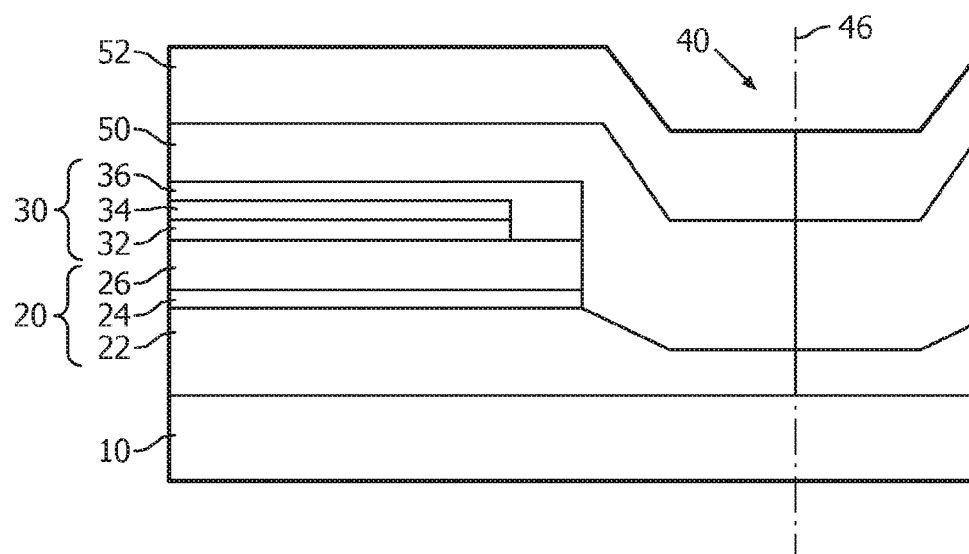
FIG. 1 shows a schematic drawing of a light emitting diode structure, in side section.

FIG. 1 illustrates a method of manufacturing a flip chip LED product. A substrate 10, in the example of sapphire, has a light emitting stack 20 formed on the substrate, made up of an n-type semiconductor layer 22, a light emitting layer 24 and a p-type semiconductor layer 26. In the embodiment, the light emitting layer is a multiple layer stack.

Above the light emitting stack 20 is deposited a metallization 30 including multiple layers of metal. The metallization 30 includes an ohmic contact layer 32 for contacting the p-type semiconductor layer, a reflective layer 34 and a guard metal layer 36. The ohmic contact 32 may be of Ni, Ag or Pd, the reflective layer 34 of Ag and the guard metal layer 36 may be a Ti layer, TiW layer, TiN layer or a TiW/WiW: N/TiW multilayer.

After deposition of the metallization 30 die edge trenches 40 are formed extending through the metallization 30, the p-type semiconductor layer 26 and the light emitting layer 24 into the n-type semiconductor layer 22. These die edge trenches 40 define the streets, which are used in a later processing step to singulate individual dies, as discussed below. Note that the layer 22 is not fully etched and the trench extends only partially into the n-type semiconductor layer. Further note that the vertical scale of the metallization 30 is highly exaggerated in the Figures.

Further layers are then deposited over the structure. These include a dielectric layer 50 and a contact layer 52. The dielectric layer 50 is an insulating layer for example of SiN and is deposited over the metallization 30 and in the trenches 40.

The contact layer 52 may be a metal or metallic layer to make contact to the n-type semiconductor layer 22 or the p-type semiconductor layer through contact holes (not shown) in the dielectric layer 50 or by connecting to the n-type semiconductor layer 22 in the region of the die edge trench. Multiple contact layers may be provided if required to provide, for example, for separate layers to contact the n-type and the p-type semiconductor layers.

After fabrication, the devices may be separated along the trenches 40 along scribe planes 46 to form individual dies. This may be done by scribing along the edge regions which in this connection may be referred to as streets.

Figure 2:
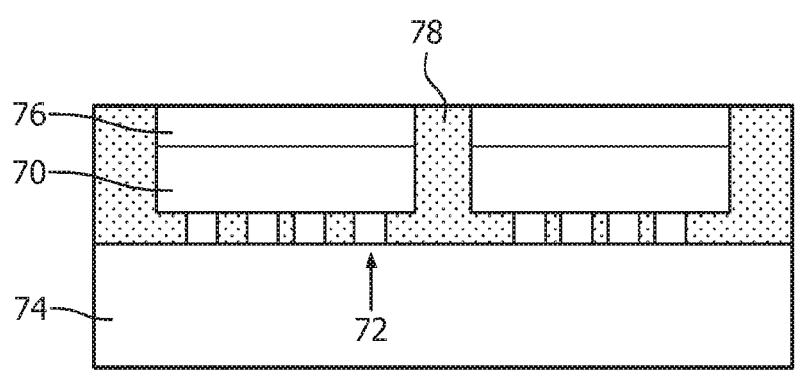
FIG. 2 shows a package including the light emitting diode structure of FIG. 1.

The devices may be mounted individually or in groups to form a packaged light emitting diode as illustrated in FIG. 2. During this process, the sapphire substrate 10 may be removed to result in a very thin die structure 70. This can result in a total thickness of the die structure 70 being below 10·m. This thin die structure 70 is bonded by, for example, gold pillar-like structures 72 acting as bump bonds onto a package substrate 74. The thin die structure is inverted compared to FIG. 1 with the upper layer illustrated in FIG. 1 facing the package substrate 74.

A cover platelet 76 is provided which includes a phosphor to absorb the light emitted by the LED and re-emit. The devices are surrounded by a silica/titanium oxide filled silicone matrix 78.

Regardless of the exact packaging process used, the packaging process may result in complex stress build-up which may result in a number of defects.

The inventors have realized that die edge defects may occur in the guard metal layer 36, dielectric layer 50 or in a layer 22, 26 at the edge of the die. These defects can cause delamination, for example of the ohmic contact 32 or guard metal 36. Alternatively or additionally the dielectric 50 may fracture.

Figure 3:
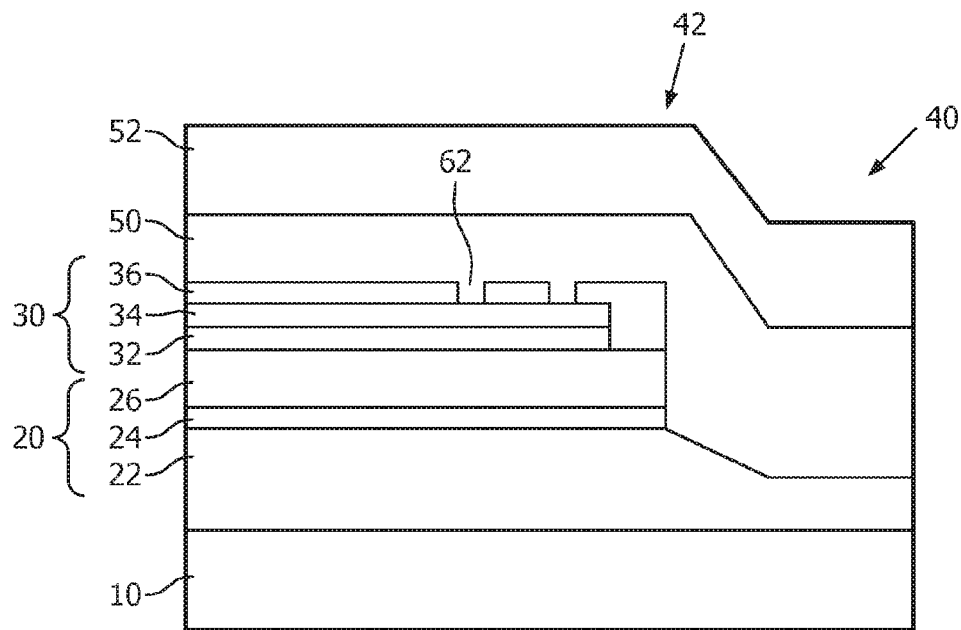
FIG. 3 shows a first embodiment in side section.
Figure 4:
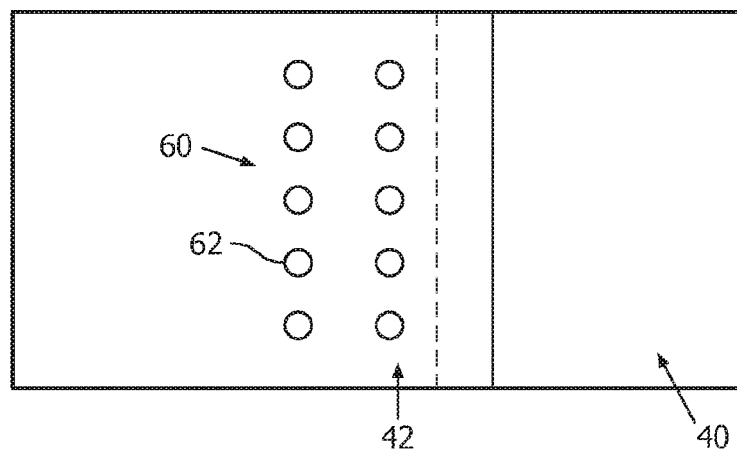
FIG. 4 shows the FIG. 3 arrangement in schematic top view.

To address die edge defects in a first embodiment illustrated in FIGS. 3 and 4 a pattern 60 (FIG. 4) is provided in the guard metal 36 in the edge region 42. Note that the dashed line in FIG. 4 is the edge of the ohmic contact 32 and reflective layer 34.

The edge region 42 is the region of the light emitting stack 20 and metallization 30 adjacent the die edge trench 40.

The pattern 60 includes a plurality of pattern elements 62, in this embodiment a plurality of through holes 62 passing through the guard metal 36 in the edge region 42.

The through holes extend parallel with the die edge trench. In the example shown, there are two parallel rows of elements 62, each row extending parallel to the die edge trench. In this way, the elements follow the outer edge of the light emitting device after it has been separated. There can instead be a single row of elements, or more than two rows.

The through holes 62 act as stress relief elements which locally interrupt the guard metal 36 and release the intrinsic stress in that layer, the stress building up during manufacture or processing of the device.

To form the through holes 62, after the step of depositing the guard metal 36, the pattern 60 is formed in resist and a selective etch is used to etch the through holes 62 in the guard metal. The resist is then removed.

In this way, die edge defects in the device may be reduced.

The pattern of stress relief elements is a plurality of through holes 62 arranged around the edge region 42 around the whole device. In the example shown, the through holes are circular.

The stress relief elements 62 may have a diameter 1 to 200·m preferably 2 to 100·m, and may be arranged in the edge region which in this embodiment extends up to 200·m, in embodiments up to 150·m, or 100·m from the die edge. The stress relief elements 62 may be arranged in rows, as indicated, in which case there may be 1 to 50, preferably 2 to 10 or even 2 to 5 rows.

In a particularly preferred arrangement to influence the edge, some stress relief elements of significant size, 5·m to 20·m, preferably 5·m to 15·m, are provided relatively close to the die edge, in particular within 50·m or preferably 25·m. The elements may be spaced from the edge by at least 1·m, preferably at least 5·m. Note that in the case of a circular element, the "size" is the diameter and in the case of a non-circular element the "size" is the maximum distance across the element. Accordingly, "size" is used as a shorthand for "maximum dimension".

Stress relief elements of size at least 5·m within 25·m of the edge but spaced from the edge may be particularly effective at providing stress relief.

Such an arrangement of stress relief elements provided only in the edge region, in this embodiment through holes, provides efficient stress relief at the edge of the metallization 30 and hence can reduce die edge defects.

Alternative stress relief elements are possible, and will be described below. Such stress relief elements may have the same preferred sizes and arrangements as discussed in the preceding paragraphs.

The stress relief elements according to embodiments of the invention achieve the most optimum effect in the edge region, and therefore the stress relief elements are only provided in the edge region in order to optimally reduce die edge defects. In other words, providing stress relief elements outside the edge region does not result in an optimum reduction of die edge defects.

In alternative implementations of such stress relief elements, the through holes 62 may simply be arranged in a less ordered arrangement in the edge region 42 in a similar manner to the embodiment of FIGS. 5 and 6 below.

In alternative arrangements slots extending longitudinally for a distance 1 to 1000·m, for example parallel to the edge of the device and in the edge region 42 may be provided. The width of the slots may be 1 to 200·m preferably 2 to 100·m. Again, it is preferred to provide some stress relief elements within 50·m or preferably 25·m of the die edge. Thus, in some preferred embodiments the edge region extends only 50·m or preferably 25·m from the die edge.

In an alternative arrangement, the guard metal is not etched through but is simply etched sufficiently to reduce its thickness to form stress relief elements.

In a further variation, through holes acting as stress relief elements may be formed in both the dielectric 50 and the guard metal 36. In a further variation, the through holes may be formed in the dielectric only.

Figure 5:
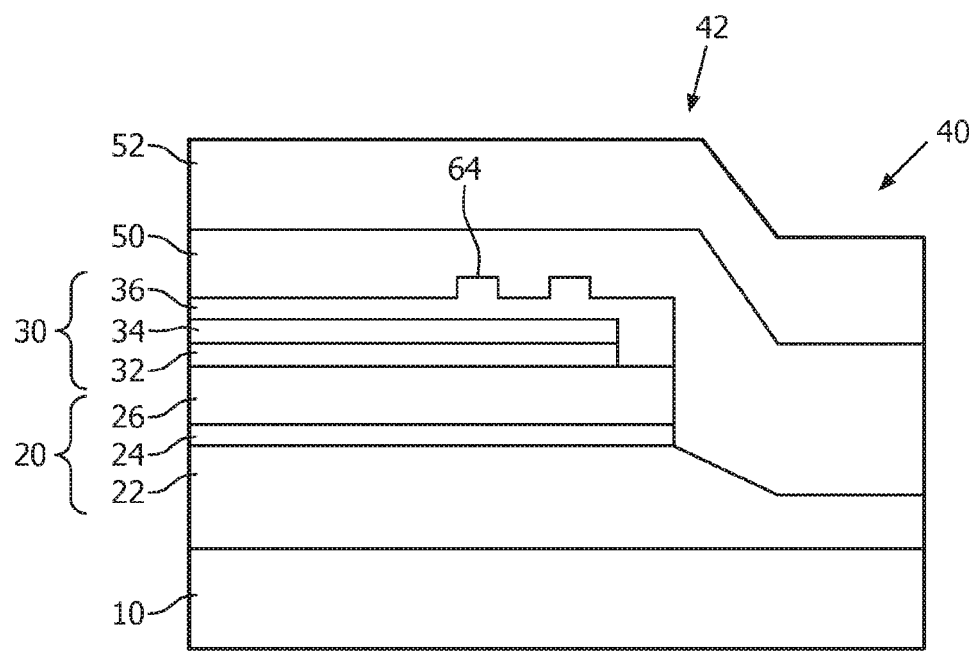
FIG. 5 shows a second embodiment in side section.
Figure 6:
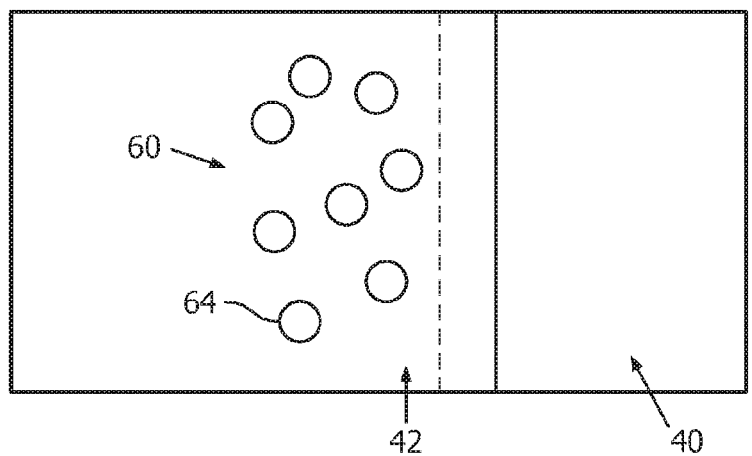
FIG. 6 shows the FIG. 5 arrangement in schematic top view.

In the embodiment of FIGS. 5 and 6, the stress relief elements are formed by a local thickening of the guard metal 36 to form stress relief elements 64. In particular, in the edge region 42 an additional thickness of guard metal is formed in a pattern 60 of stress relief elements 64. The pattern may be formed by depositing a layer of the guard metal 36, forming a pattern 60 in lift-off resist, then depositing an additional thickness of the guard metal 36 and then lifting off the lift-off resist to remove the guard metal 36 except in the pattern. Thus, the elements 64 are formed as two layers of guard metal whereas the remaining part of the guard metal layer is formed as a single layer.

In this example the stress relief elements 64 are not arranged in rows but in a less ordered arrangement across the edge region 42 adjacent to the die edge trench. In this way, the stress relief elements are adjacent the outer edge of the light emitting device after it has been separated. Instead of this less ordered arrangement of stress relief elements the stress relief elements may be arranged in one or more rows.

Figure 7:
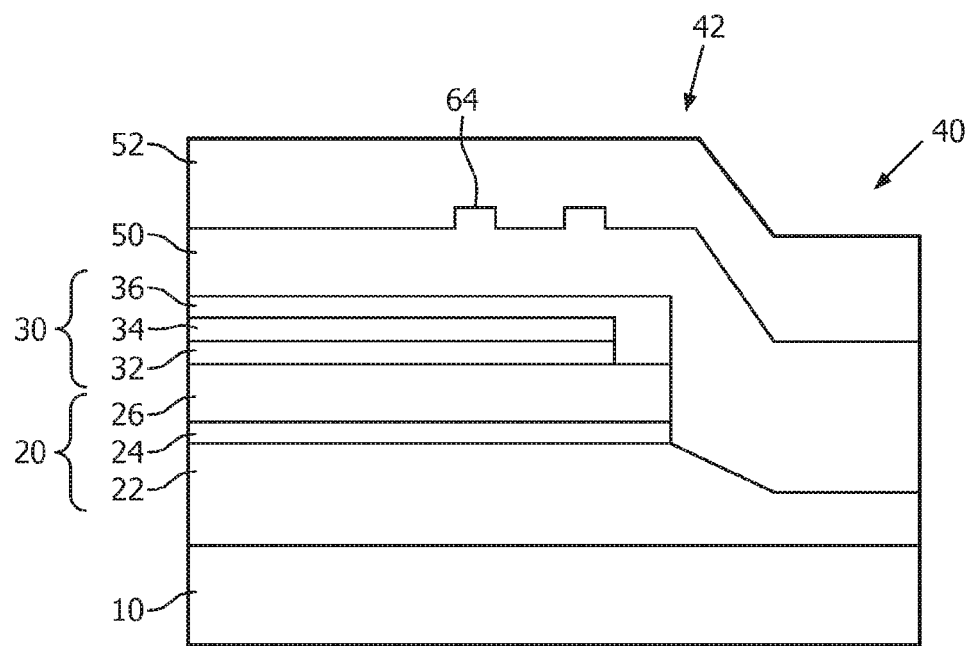
FIG. 7 shows a third embodiment in side section.
Figure 8:
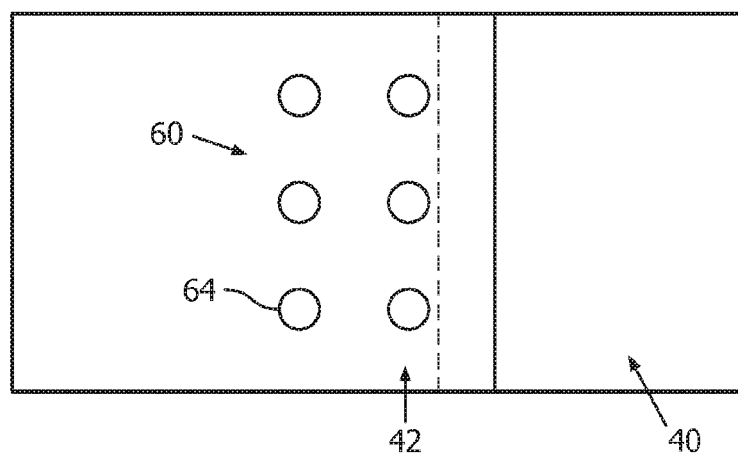
FIG. 8 shows the FIG. 7 arrangement in schematic top view.

As well as this approach of locally thickening the guard metal 36, the same may also be carried out in the dielectric as illustrated in the embodiment of FIGS. 7 and 8.

In this approach, after deposition of the guard metal 36 and the formation of the trenches 40, a dielectric 50 is deposited. A resist is then deposited on dielectric 50 in a pattern 60. The dielectric is then partially etched back to leave dielectric 50 with additional thickness as stress relief elements 64 in the edge region 42.

Figure 9:
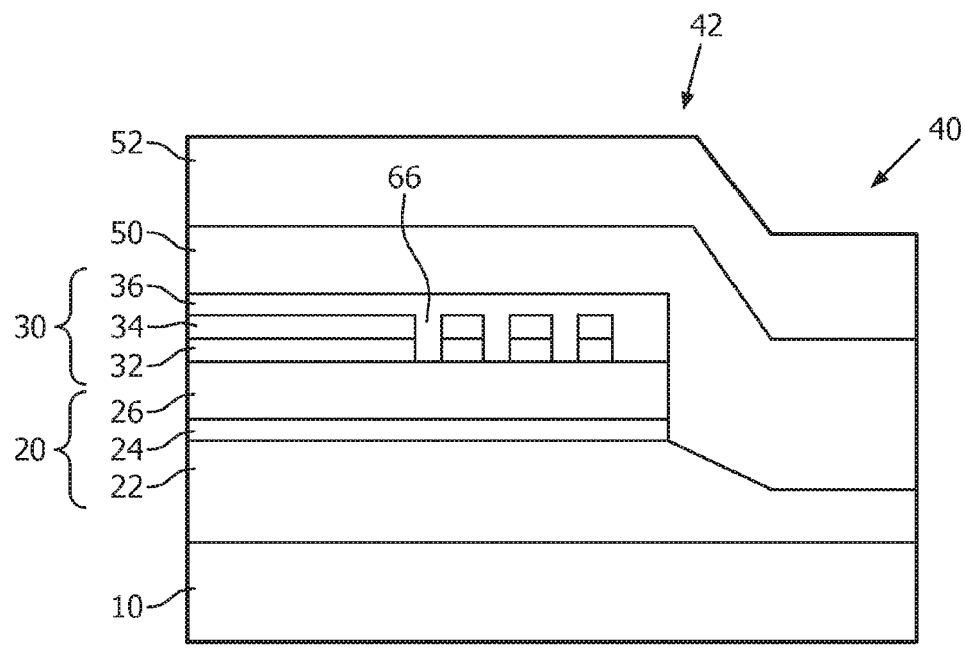
FIG. 9 shows a fourth embodiment in side section.
Figure 10:
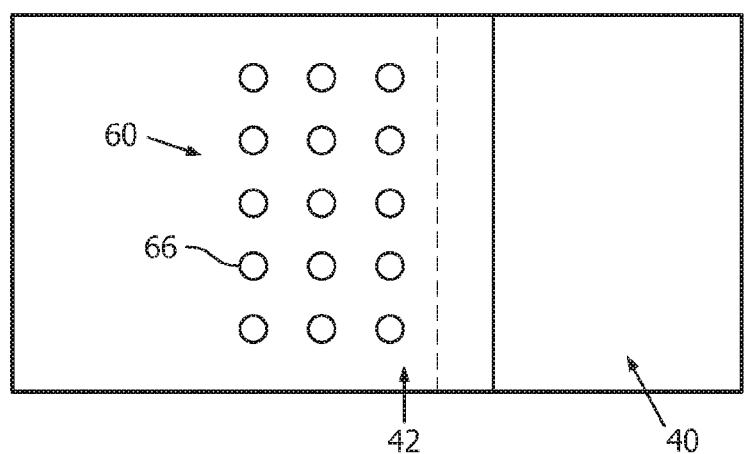
FIG. 10 shows the FIG. 9 arrangement in schematic top view.

As well as using stress relief elements as described above, delamination may also be reduced using anchor elements. In the embodiment of FIGS. 9 and 10, a plurality of holes are formed in the ohmic contact 32 and reflective layer 34 in a pattern 60 in the edge region 42, before the deposition of the guard layer 36. In this way, the guard layer 36 in the holes may act as anchor elements 66. The guard layer 36 extends to the semiconductor layers of the light emitting stack 20.

This arrangement improves the adhesion of the guard layer 36 by improving the anchoring of the guard layer 36 which improves its adhesion and hence reduces the risk of delamination of the guard layer 36.

Figure 11:
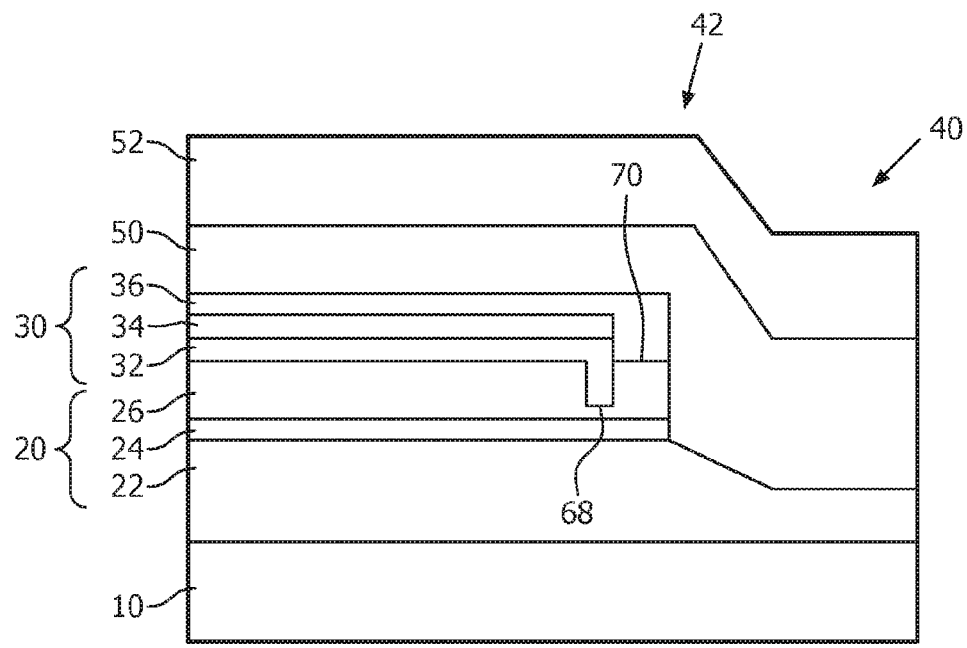
FIG. 11 shows a fifth embodiment in side section.
Figure 12:
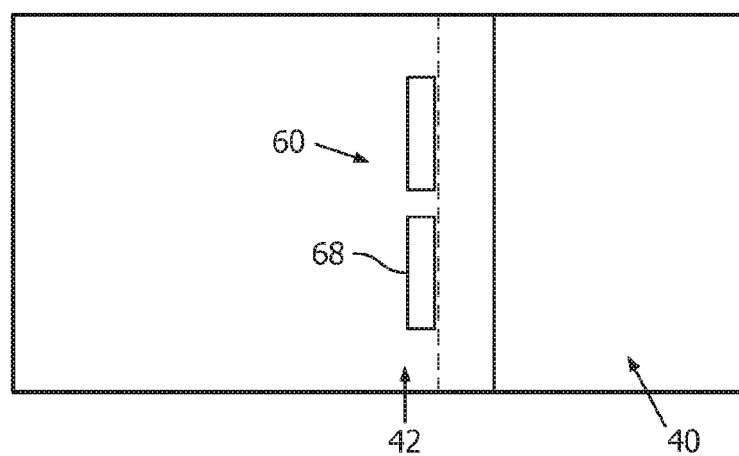
FIG. 12 shows the FIG. 11 arrangement in schematic top view.

In a further embodiment illustrated in FIGS. 11 and 12, an alternative anchoring approach is adopted. In this case, an anchor trench 70 is formed in a pattern 60 in the edge region 42 before the deposition of the metallization stack. The first layer of the metallization stack, in the embodiment the p-type contact 32, accordingly is deposited into the anchor trench 70 to form anchor elements 68.

Anchor elements 66, 68 may be formed only in the edge regions 42 as shown. Alternatively, the anchor elements may be formed across the whole of the device.

This approach further improves the adhesion of the metallization stack by anchoring the stack and so reduces the risk of delamination of the metallization stack.

The anchor elements 66, 68 may be formed as circular, square or rectangular elements with a maximum size 1 to 200•m preferably 2 to 100•m, and be arranged in the edge region which in this embodiment extends up to 200•m, in embodiments up to 150•m, or 100•m from the die edge. The anchor elements 66, 68 may be arranged in rows, as illustrated in FIG. 10, in which case there may be 1 to 50, preferably 2 to 10 or even 2 to 5 rows.

In a particularly preferred arrangement to influence the edge, some anchor elements of significant size, 5•m to 20•m, preferably 5•m to 15•m, are provided relatively close to the die edge, in particular within 50•m or preferably 25•m. The elements may be spaced from the edge by at least 1•m, preferably at least 5•m.

Anchor elements of size at least 5•m within 25•m of the edge but spaced from the edge may be particularly effective at providing anchoring at the die edge region.

Alternative anchor elements may be formed as illustrated in FIG. 12. These are in the form of longitudinal anchor elements extending along the die edge. In this case, the length is significantly greater than the width. The width may be 2•m to 20•m and the length 5•m to 1000•m, preferably 5•m to 200•m. The length may be at least 50% higher than the width, preferably the length being at least double the width.

It will be appreciated by those skilled in the art that the separate approaches illustrated above may be combined in a single device for further improvement which will accordingly have multiple patterns 60 in the edge region 42 for reducing die edge defects.

Further, the patterns described in connection with one embodiment may be used with other embodiments.

The skilled person will realize that variations of the above approaches are possible. Indeed, for some applications the division of devices may form multiple devices on a single die: in this case some trenches may be formed to separate devices without dividing each separate device in the separation step. In this way a die with for example four or six individual devices may be achieved. A packaged device may be formed with multiple single dies on a common substrate.

Further, as well as providing anchor elements at the edges, anchor elements may also be provided not merely in the edge region but alternatively or additionally across the whole of the device. The further anchor elements provided further from the edge may improve anchoring over the whole device.

The substrate need not be a sapphire substrate and alternative substrates may be used, for example Si, GaAs or glass. Optional layers may be provided on the substrate, such as a semi-insulating layer. Such layers may provide a smooth surface for the deposition of the light emitting stack.

A number of different light emitting stack formations are possible. For example, the light emitting stack may be formed of doped silicon in the form of a p-i-n stack or alternative semiconductors such as III-V semiconductors, nitrides, and heterostructures formed. The active region may be a multi-layer stack for improved light emission.

The exact size and location of the pattern of stress relief elements and anchor elements may be varied. The pattern may be regular or irregular, and the stress relief and anchor elements may be arranged around the whole of the die or only in certain regions. The edge region may be the outermost 2•m to 100•m of the die, for example.

A number of alternative methods by which the dies are separated may be used. Physical scribing, laser scribing, the use of saw, cleaving and/or any separation technique may be used.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A solid state light emitting device, comprising:
a light emitting stack of a plurality of semiconductor layers;
a metallization on the light emitting stack including at least one metallization layer and comprising a guard layer of metal;
a dielectric layer on the guard layer of the metallization;
a plurality of stress-relief elements and/or anchor elements in an edge region of the metallization and/or dielectric layer, the edge region being the region of the solid state light emitting device adjacent to the edge of the solid state light emitting device, wherein the stress-relief elements are formed by a plurality of discrete regions of increased thickness or reduced thickness in the guard layer.

2. A solid state light emitting device according to claim 1 wherein at least some of the stress-relief elements and/or anchor elements in the edge region have a maximum dimension of at least 5 µm and are within 50 µm of the edge of the solid state light emitting device.

3. The solid state light emitting device of claim 1 wherein holes in through the guard layer in the edge region form at least some of the stress-relief elements.

4. The solid state light emitting device of claim 1 wherein the metallization comprises:
   an ohmic contact layer on the light emitting stack having through holes; and
   the guard layer over the ohmic contact layer extending into the through holes as the anchor elements for anchoring the guard layer.

5. The solid state light emitting device of claim 1 wherein the metallization comprises an ohmic contact layer on the light emitting stack and extending into anchor trenches extending into the light emitting stack as the anchor elements for anchoring the ohmic contact layer.

6. The solid state light emitting device of claim 1, further comprising a contact layer of a metal over the dielectric layer.

7. The solid state light emitting device of claim 1, wherein the stress-relief elements are spaced from the edge of the solid state light emitting device by at least 1 µm.

8. The solid state light emitting device of claim 1, wherein the plurality of discrete regions forming the stress-relief elements have increased thickness in the guard layer.

9. The solid state light emitting device of claim 1, wherein the plurality of discrete regions forming the stress-relief elements have reduced thickness in the guard layer.

10. The solid state light emitting device of claim 1, wherein the stress-relief elements and/or anchor elements are arranged in one or more rows, each of the rows extending parallel to the edge of the solid state light emitting device.

11. The solid state light emitting device of claim 1, wherein the edge of the solid state light emitting device is an edge of a die.

12. The solid state light emitting device of claim 1, wherein the stress-relief elements and/or anchor elements are structured to reduce of a risk of delamination in the solid state light emitting device during a fabrication process.

* * * * *